United States Patent
Chang et al.

(10) Patent No.: US 11,507,275 B2
(45) Date of Patent: Nov. 22, 2022

(54) MEMORY UNIT WITH MULTI-BIT INPUT LOCAL COMPUTING CELL FOR MULTI-BIT CONVOLUTIONAL NEURAL NETWORK BASED COMPUTING-IN-MEMORY APPLICATIONS, MEMORY ARRAY STRUCTURE WITH MULTI-BIT INPUT LOCAL COMPUTING CELL FOR MULTI-BIT CONVOLUTIONAL NEURAL NETWORK BASED COMPUTING-IN-MEMORY APPLICATIONS AND COMPUTING METHOD THEREOF

(71) Applicant: NATIONAL TSING HUA UNIVERSITY, Hsinchu (TW)

(72) Inventors: Meng-Fan Chang, Taichung (TW); Pei-Jung Lu, New Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 179 days.

(21) Appl. No.: 17/082,000

(22) Filed: Oct. 27, 2020

(65) Prior Publication Data

US 2022/0129153 A1 Apr. 28, 2022

(51) Int. Cl.
*G06F 3/06* (2006.01)
*G06N 3/02* (2006.01)
*G11C 11/54* (2006.01)
*G11C 11/40* (2006.01)
*G11C 11/4094* (2006.01)

(52) U.S. Cl.
CPC ............ *G06F 3/061* (2013.01); *G06F 3/0655* (2013.01); *G06F 3/0673* (2013.01); *G06N 3/02* (2013.01); *G11C 11/40* (2013.01); *G11C 11/4094* (2013.01); *G11C 11/54* (2013.01)

(58) Field of Classification Search
None
See application file for complete search history.

(56) References Cited

U.S. PATENT DOCUMENTS

| | | | | |
|---|---|---|---|---|
| 6,137,707 A * | 10/2000 | Srinivasan | ............. | G11C 15/00 365/49.18 |
| 6,707,693 B1 * | 3/2004 | Ichiriu | .................... | G11C 15/00 711/108 |
| 6,842,360 B1 * | 1/2005 | Srinivasan | ............. | G11C 15/04 365/49.1 |
| 8,625,320 B1 * | 1/2014 | Argyres | ................. | G11C 15/04 365/49.1 |

(Continued)

*Primary Examiner* — J. H. Hur
(74) *Attorney, Agent, or Firm* — CKC & Partners Co., LLC

(57) ABSTRACT

A memory unit is controlled by a first word line and a second word line. The memory unit includes a memory cell and a multi-bit input local computing cell. The memory cell stores a weight. The memory cell is controlled by the first word line and includes a local bit line transmitting the weight. The multi-bit input local computing cell is connected to the memory cell and receives the weight via the local bit line. The multi-bit input local computing cell includes a plurality of input lines and a plurality of output lines. Each of the input lines transmits a multi-bit input value, and the multi-bit input local computing cell is controlled by the second word line to generate a multi-bit output value on each of the output lines according to the multi-bit input value multiplied by the weight.

17 Claims, 12 Drawing Sheets

(56) References Cited

U.S. PATENT DOCUMENTS

| | | | | |
|---|---|---|---|---|
| 2010/0328981 A1* | 12/2010 | Deshpande | ............ | G11C 15/04 |
| | | | | 365/49.1 |
| 2013/0046928 A1* | 2/2013 | Ramaraju | ............... | G06F 9/355 |
| | | | | 711/108 |
| 2014/0085957 A1* | 3/2014 | Deshpande | ............ | G11C 15/04 |
| | | | | 365/49.17 |
| 2019/0043583 A1* | 2/2019 | Majumder | ............. | G11C 15/04 |
| 2021/0125663 A1* | 4/2021 | Chang | ................... | G11C 11/412 |
| 2022/0044714 A1* | 2/2022 | Chang | .................... | G06N 3/063 |

* cited by examiner

MEMORY UNIT WITH MULTI-BIT INPUT LOCAL COMPUTING CELL FOR MULTI-BIT CONVOLUTIONAL NEURAL NETWORK BASED COMPUTING-IN-MEMORY APPLICATIONS, MEMORY ARRAY STRUCTURE WITH MULTI-BIT INPUT LOCAL COMPUTING CELL FOR MULTI-BIT CONVOLUTIONAL NEURAL NETWORK BASED COMPUTING-IN-MEMORY APPLICATIONS AND COMPUTING METHOD THEREOF

BACKGROUND

Technical Field

The present disclosure relates to a memory unit for a plurality of multi-bit convolutional neural network (CNN) based computing-in-memory (CIM) applications, a memory array structure for the multi-bit CNN based CIM applications and a computing method thereof. More particularly, the present disclosure relates to a memory unit with a multi-bit input local computing cell for a plurality of multi-bit CNN based CIM applications, a memory array structure with the multi-bit input local computing cell for the multi-bit CNN based CIM applications and a computing method thereof.

Description of Related Art

In these years, due to the industrial growth of mobile device, medical electrical equipment, portable storage, etc., requirement of memory with low power, high speed and high density is increased. Computation-in-Memory (CIM) is a promising solution to improve the energy efficiency of multiply and accumulate (MAC) operations for AI chips, and multiple-bit convolutional neural network (CNN) is required for high inference accuracy in many applications.

In the CNN application, the more complex network model, the higher input/weight precision needed to achieve better accuracy. Moreover, in order to enhance the operation number per second, it is important to decrease latency. Therefore, increasing input/weight bits computed per cycle is necessary. However, the conventional structure will face some difficulties. First, in the conventional CIM SRAM structure, when using a discharge technique on a bit line/bit line bar (BL/BLB) to perform the MAC operation, the voltage level of the BL/BLB may be vulnerable to timing variation. Second, in order to increase the operation number per cycle, the conventional CIM SRAM structure is needed to add some transistors to perform the MAC operation, thereby incurring higher area overhead.

Accordingly, a memory unit with a multi-bit input local computing cell for a plurality of multi-bit CNN based CIM applications, a memory array structure with the multi-bit input local computing cell for the multi-bit CNN based CIM applications and a computing method thereof having the features of increasing the computations in one cycle and avoiding time variation are commercially desirable.

SUMMARY

According to one aspect of the present disclosure, a memory unit with a multi-bit input local computing cell for a plurality of multi-bit convolutional neural network (CNN) based computing-in-memory (CIM) applications is controlled by a first word line and a second word line. The memory unit with the multi-bit input local computing cell for the multi-bit CNN based CIM applications includes at least one memory cell and the multi-bit input local computing cell. The at least one memory cell stores a weight. The at least one memory cell is controlled by the first word line and includes a local bit line transmitting the weight. The multi-bit input local computing cell is connected to the at least one memory cell and receives the weight via the local bit line. The multi-bit input local computing cell includes a plurality of input lines and a plurality of output lines. Each of the input lines transmits a multi-bit input value, and the multi-bit input local computing cell is controlled by the second word line to generate a multi-bit output value on each of the output lines according to the multi-bit input value multiplied by the weight.

According to another aspect of the present disclosure, a memory array structure with a multi-bit input local computing cell for a plurality of multi-bit CNN based CIM applications is controlled by a first word line and a second word line. The memory array structure with the multi-bit input local computing cell for the multi-bit CNN based CIM applications includes a plurality of memory units connected to each other via the first word line and the second word line. Each of the memory units includes at least one memory cell and the multi-bit input local computing cell. The at least one memory cell stores a weight. The at least one memory cell is controlled by the first word line and includes a local bit line transmitting the weight. The multi-bit input local computing cell is connected to the at least one memory cell and receives the weight via the local bit line. The multi-bit input local computing cell includes a plurality of input lines and a plurality of output lines. Each of the input lines transmits a multi-bit input value, and the multi-bit input local computing cell is controlled by the second word line to generate a multi-bit output value on each of the output lines according to the multi-bit input value multiplied by the weight.

According to further another aspect of the present disclosure, a computing method of the memory array structure with the multi-bit input local computing cell for the multi-bit CNN based CIM applications is controlled by the first word line and the second word line. The computing method includes performing a voltage level applying step and a computing step. The voltage level applying step includes applying a plurality of voltage levels to the first word line, the second word line, the weight and the input lines of each of the memory units, respectively. The computing step includes driving the multi-bit input local computing cell of each of the memory units to compute the voltage levels of the input lines and the weight so as to generate the multi-bit output value on each of the output lines according to the multi-bit input value multiplied by the weight.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Before describing any embodiments in detail, some terms used in the following are described. A voltage level of "1" represents that the voltage is equal to a power supply voltage VDD. The voltage level of "0" represents that the voltage is equal to a ground voltage GND. A PMOS transistor and an NMOS transistor represent a P-type MOS transistor and an N-type MOS transistor, respectively. Each transistor has a source, a drain and a gate.

Figure 1:
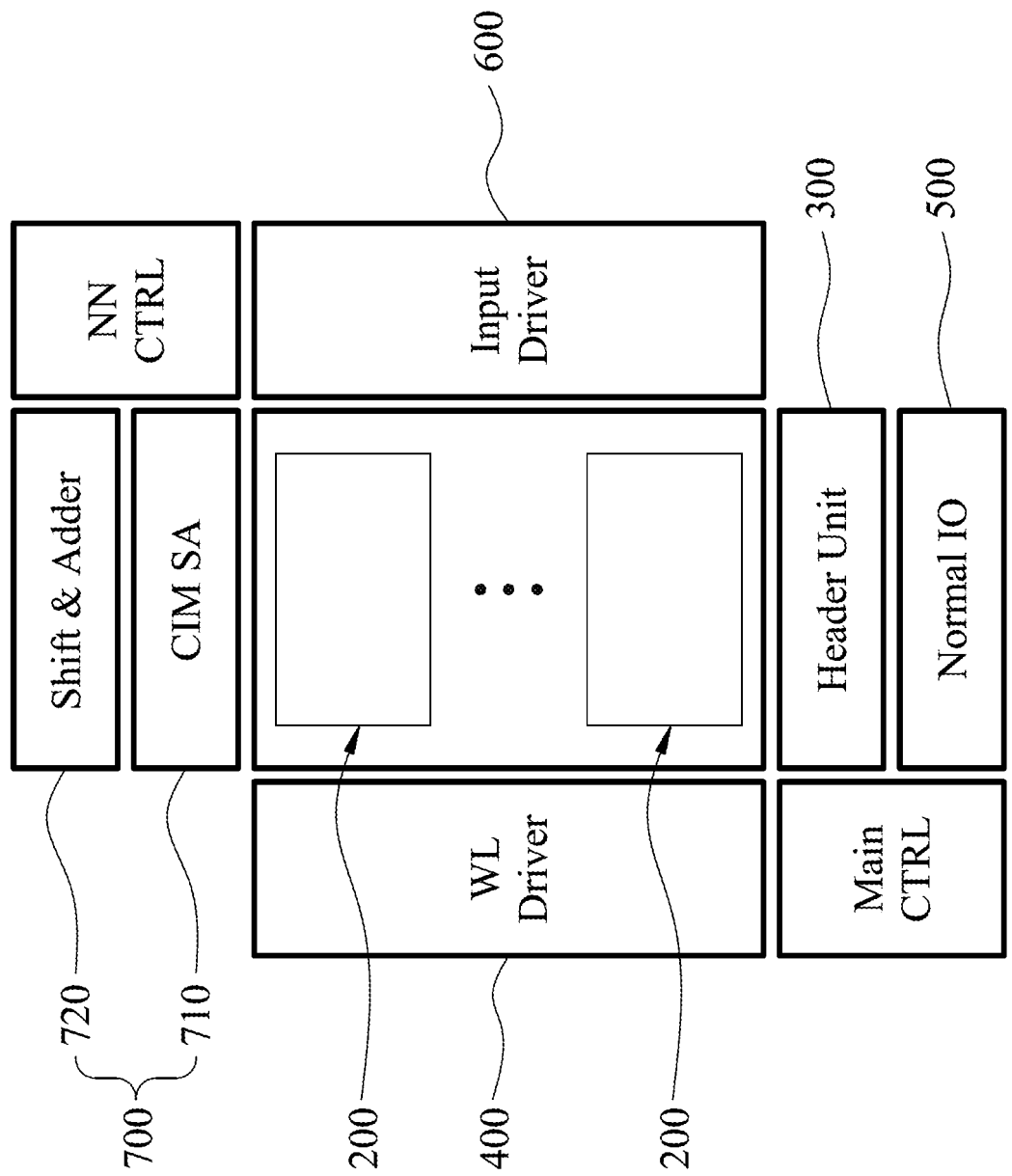
FIG. 1 shows a block diagram of a memory array structure with a multi-bit input local computing cell for a plurality of multi-bit convolutional neural network (CNN) based computing-in-memory (CIM) applications according to one embodiment of the present disclosure.
Figure 2:
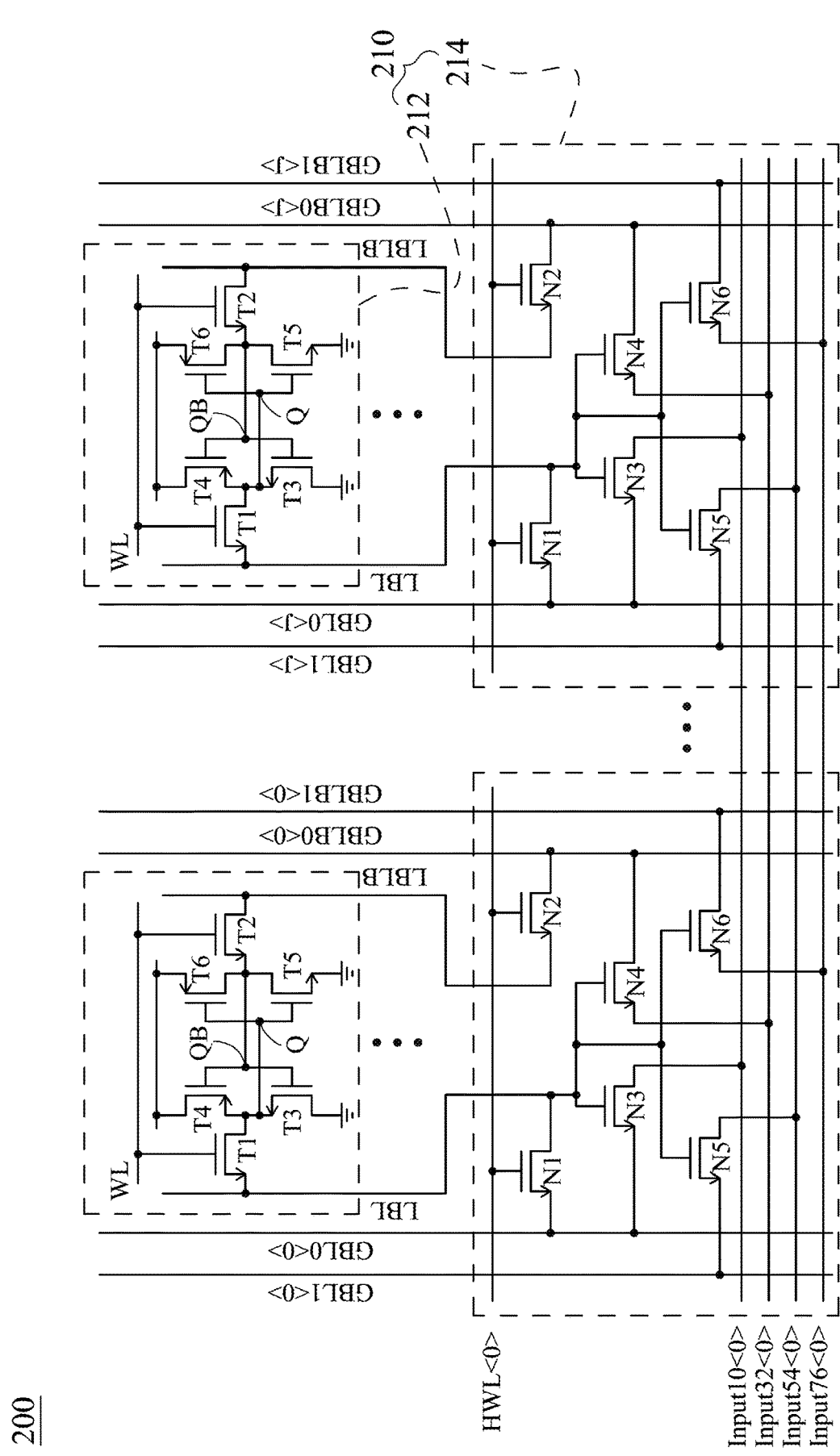
FIG. 2 shows a circuit diagram of a plurality of memory units of the memory array structure of FIG. 1.
Figure 3:
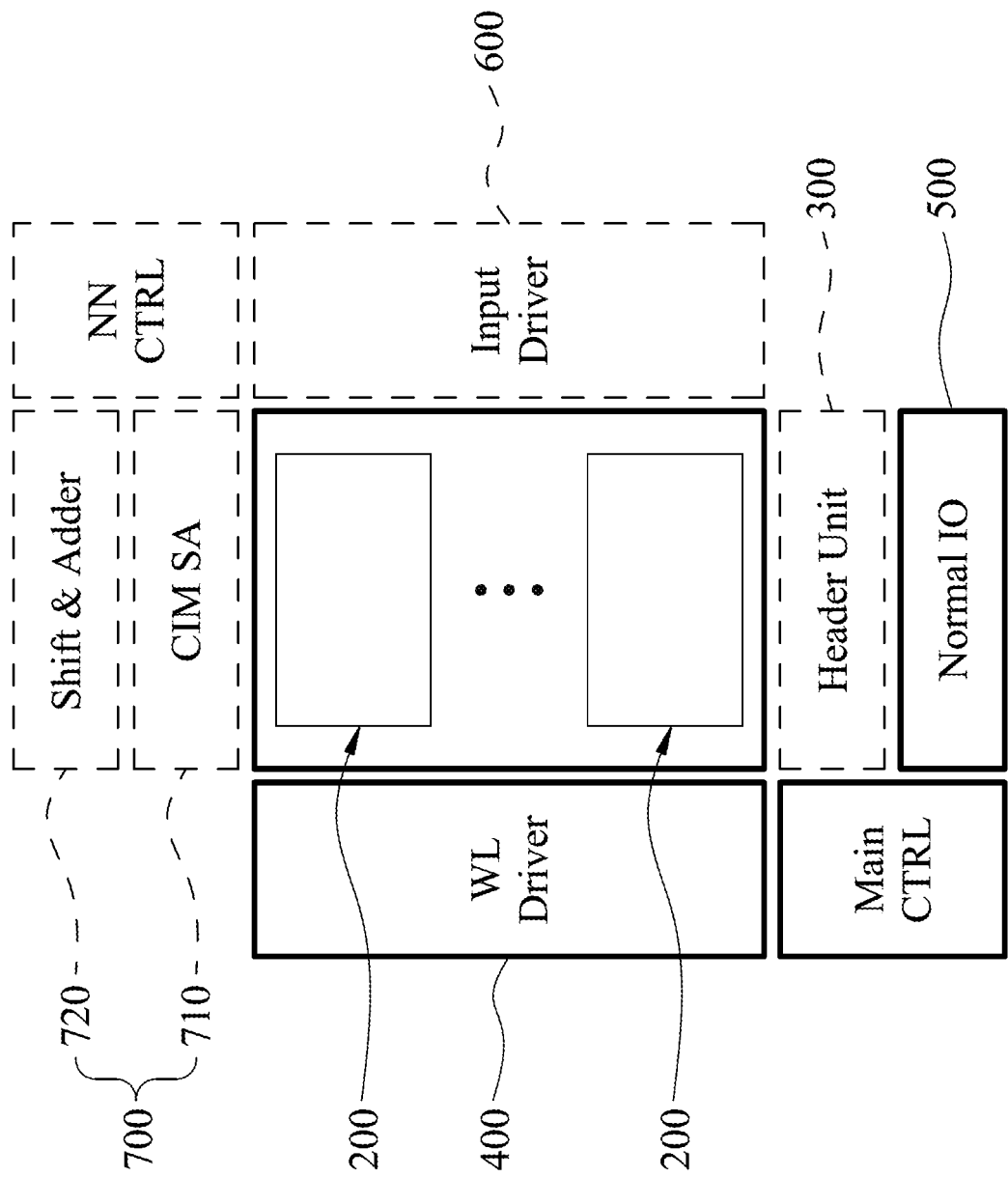
FIG. 3 shows one block diagram of the memory array structure with the multi-bit input local computing cell for the multi-bit CNN based CIM applications of FIG. 1, which is in a normal mode.
Figure 4:
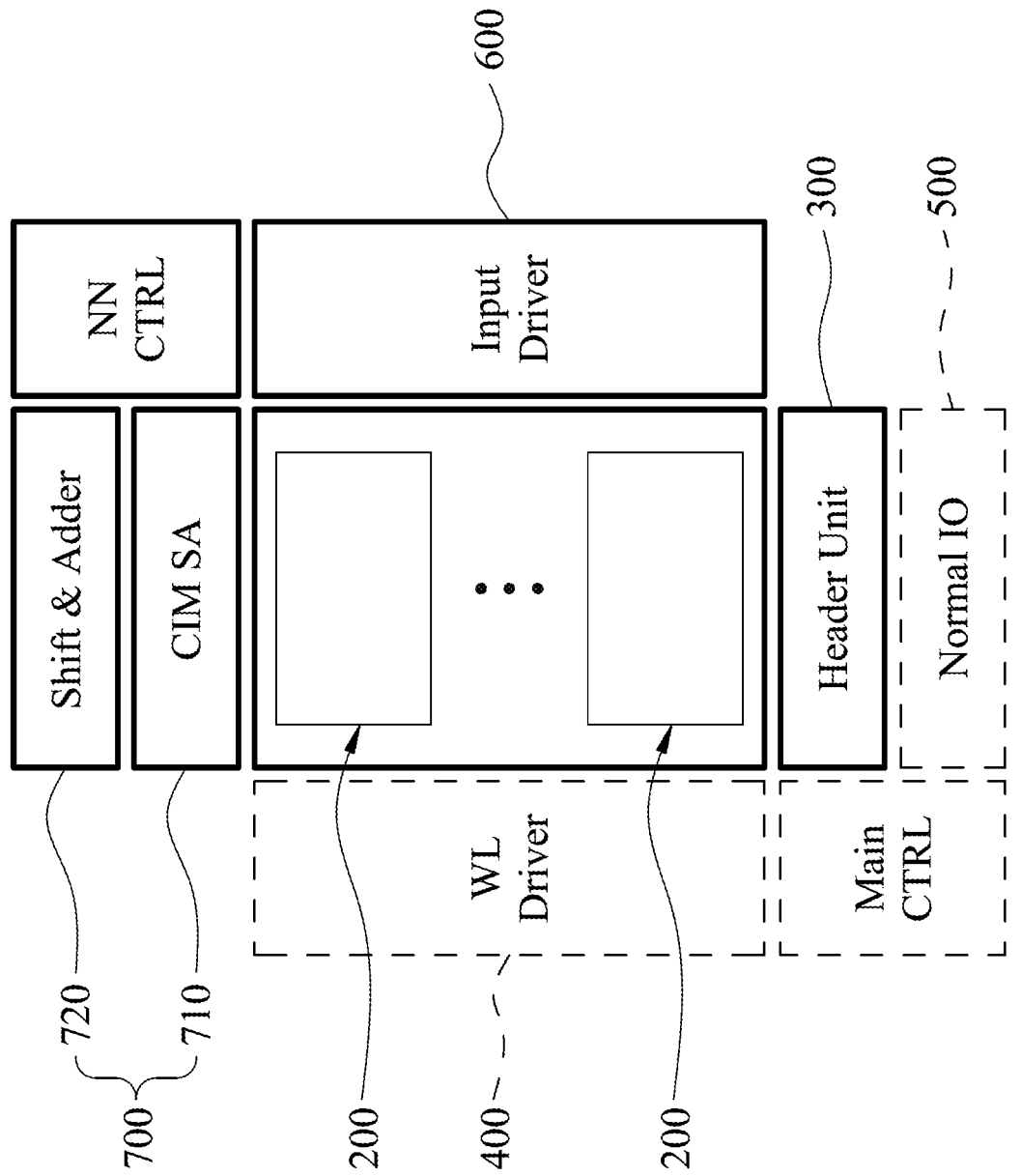
FIG. 4 shows another block diagram of the memory array structure with the multi-bit input local computing cell for the multi-bit CNN based CIM applications of FIG. 1, which is in a CIM mode.
Figure 5:
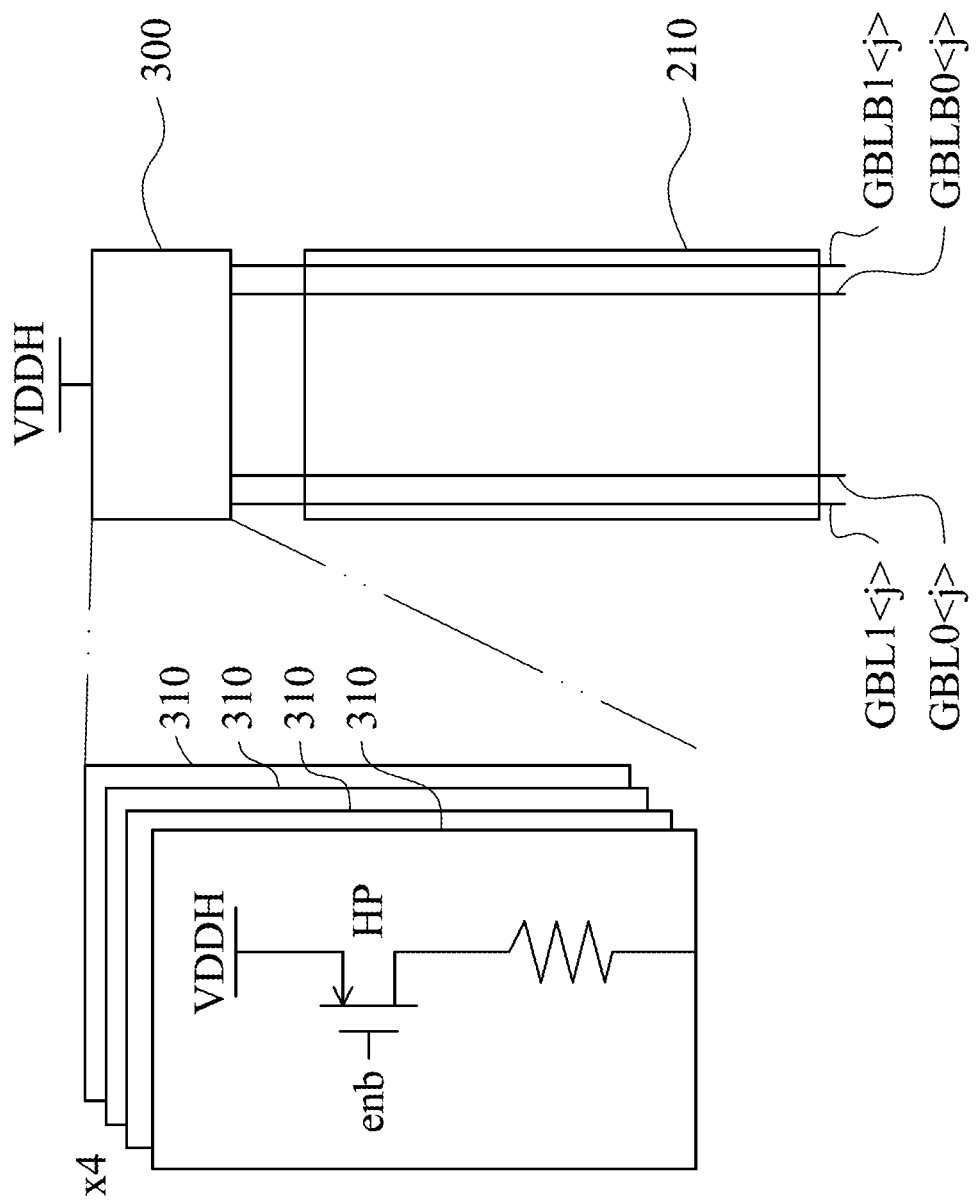
FIG. 5 shows a schematic view of the memory units and a header unit of the memory array structure of FIG. 1.

FIG. 1 shows a block diagram of a memory array structure 100 with a multi-bit input local computing cell 214 for a plurality of multi-bit convolutional neural network (CNN) based computing-in-memory (CIM) applications according to one embodiment of the present disclosure. FIG. 2 shows a circuit diagram of a plurality of memory units 210 of the memory array structure 100 of FIG. 1. FIG. 3 shows one block diagram of the memory array structure 100 with the multi-bit input local computing cell 214 for the multi-bit CNN based CIM applications of FIG. 1, which is in a normal mode. FIG. 4 shows another block diagram of the memory array structure 100 with the multi-bit input local computing cell 214 for the multi-bit CNN based CIM applications of FIG. 1, which is in a CIM mode. FIG. 5 shows a schematic view of the memory units 210 and a header unit 300 of the memory array structure 100 of FIG. 1. In FIGS. 1-5, the memory array structure 100 with the multi-bit input local computing cell 214 for the multi-bit CNN based CIM applications is controlled by a first word line WL and a second word line HWL<i> (e.g., the second word line HWL<0> in FIG. 2). The memory array structure 100 with the multi-bit input local computing cell 214 for the multi-bit CNN based CIM applications includes a plurality of local memory array units 200, a header unit 300, a word line driver 400, a normal input-output (IO) circuit 500, a CIM mode input driver 600 and a CIM readout circuit 700.

The local memory array units 200 are connected to each other. Each of the local memory array units 200 includes the memory units 210. The memory units 210 are connected to each other via the first word line WL and the second word line HWL<i>. Each of the memory units 210 includes at least one memory cell 212 and the multi-bit input local computing cell 214. In one embodiment, the number of the at least one memory cell 212 may be 16× (e.g., 16, 32, and so on).

The memory cell 212 stores a weight (1-bit weight). The memory cell 212 is controlled by the first word line WL. In detail, the memory cell 212 includes a first node Q, a second node QB, a local bit line LBL, a local bit line bar LBLB, a first memory cell transistor T1, a second memory cell transistor T2, a first inverter INV1 and a second inverter INV2. The first node Q stores the weight. The second node QB stores an inverted weight opposite to the weight of the first node Q. The local bit line LBL is connected to the multi-bit input local computing cell 214 and transmits the weight from the memory cell 212 to the multi-bit input local computing cell 214. The local bit line bar LBLB is connected to the multi-bit input local computing cell 214 and transmits the inverted weight from the memory cell 212 to the multi-bit input local computing cell 214. The first memory cell transistor T1 is connected to the first node Q, the local bit line LBL and the first word line WL. The second memory cell transistor T2 is connected to the second node QB, the local bit line bar LBLB and the first word line WL. The first inverter INV1 is located between the first node Q and the second node QB. The first inverter INV1 includes a third memory cell transistor T3 and a fourth memory cell transistor T4 connected to the third memory cell transistor T3. The second inverter INV2 is connected to the first inverter INV1. The second inverter INV2 includes a fifth memory cell transistor T5 and a sixth memory cell transistor T6 connected to the fifth memory cell transistor T5. In other words, the memory cell 212 is a 6T static random access memory (SRAM) cell. Each of the first memory cell transistor T1, the second memory cell transistor T2, the third memory cell transistor T3 and the fifth memory cell transistor T5 is the NMOS transistor. Each of the fourth memory cell transistor T4 and the sixth memory cell transistor T6 is the PMOS transistor.

The multi-bit input local computing cell 214 is connected to the memory cell 212 and receives the weight via the local bit line LBL. The multi-bit input local computing cell 214 includes a plurality of input lines and a plurality of output lines. Each of the input lines transmits a multi-bit input value, and the multi-bit input local computing cell 214 is controlled by the second word line HWL<i> to generate a multi-bit output value on each of the output lines according to the multi-bit input value multiplied by the weight. In detail, the input lines include a first input line Input10<i> and a second input line Input32<i>, a third input line Input54<i> and a fourth input line Input76<i>. The output lines include a first output bit line GBL0<j>, a first output bit line bar GBLB0<j>, a second output bit line GBL1<j> and a second output bit line bar GBLB1<j>. i is an integer which is greater than or equal to 0 and smaller than or equal to I. j is an integer which is greater than or equal to 0 and smaller than or equal to J. I and J are positive integers. In one embodiment, I and J are equal to 15 and 127, respectively, but the present disclosure is not limited thereto. In FIG. 2, the multi-bit input local computing cell 214 further includes a first local computing cell transistor N1, a second local computing cell transistor N2, a third local computing cell transistor N3, a fourth local computing cell transistor N4, a fifth local computing cell transistor N5 and a sixth local computing cell transistor N6. The first local computing cell transistor N1 is connected to the second word line HWL<0>, the local bit line LBL and the first output bit line GBL0<0>. The second local computing cell transistor N2 is connected to the second word line HWL<0>, the local bit line bar LBLB and the first output bit line bar GBLB0<0>. The third local computing cell transistor N3 is connected to the local bit line LBL, the first input line Input10<0> and the first output bit line GBL0<0>. The fourth local computing cell transistor N4 is connected to the local bit line LBL, the second input line Input32<0> and the first output bit line bar GBLB0<0>. The fifth local computing cell transistor N5 is connected to the local bit line LBL, the third input line Input54<0> and the second output bit line GBL1<0>. The sixth local computing cell transistor N6 is connected to the local bit line LBL, the fourth input line Input76<0> and the second output bit line bar GBLB1<0>. In addition, the first word line WL, the second word line HWL<0> and each of the input lines (i.e., Input10<0>, Input32<0>, Input54<0> and Input76<0>) are extended in a horizontal direction (row). Each of the output lines (i.e., GBL0<0>, GBL1<0>, GBLB0<0> and GBLB1<0>) is extended in a vertical direction (column). Each of the first local computing cell transistor N1, the second local computing cell transistor N2, the third local computing cell transistor N3, the fourth local computing cell transistor N4, the fifth local computing cell transistor N5 and the sixth local computing cell transistor N6 is the NMOS transistor.

Table 1 lists four analog signals of the multi-bit input value and four 2-bit digital signals of each of the input lines of the multi-bit input local computing cell 214 of FIG. 2. The four analog signals (i.e., VDD, V01, V10 and VSS) are corresponding to the four 2-bit digital signals (i.e., 00, 01, 10 and 11), respectively. In other words, the multi-bit input value is an analog signal and is equal to one of four voltage levels (e.g., VDD, V01, V10 and VSS). The multi-bit input values of the input lines are combined to form a combined multi-bit input value which can be represented by 8 bits (e.g., IN<7:0>). Each of the first input line Input10<0>, the second input line Input32<0>, the third input line Input54<0> and the fourth input line Input76<0> may have fourth voltage levels which are equal to VDD (e.g., 0.9 V), V01 (e.g., 0.25 V), V10 (e.g., 0.1 V) and VSS (0 V), respectively.

TABLE 1

| IN<1>, IN<0> | Input10<0> |
|---|---|
| IN<3>, IN<2> | Input32<0> |
| IN<5>, IN<4> | Input54<0> |
| IN<7>, IN<6> | Input76<0> |
| 00 | VDD |
| 01 | V01 |
| 10 | V10 |
| 11 | VSS |

Table 2 lists the currents and the voltage levels on the output lines (e.g., GBL0<0>, GBL1<0>, GBLB0<0> and GBLB1<0>) of the multi-bit input local computing cell 214 of FIG. 2. The multi-bit output value of each of the output lines can be computed by the multi-bit input value of each of the input lines and the weight. The weight is corresponding to the voltage level on the local bit line LBL. The currents (e.g., $I_{00}$, $I_{01}$, $I_{10}$ and $I_{11}$) are formed on the output lines, and then the voltage levels are formed on the output lines via the header unit 300. The multi-bit output value of each of the output lines is corresponding to the voltage level of each of the output lines.

TABLE 2

| Input10/ Input32/ Input54/ | Current on GBL0<0>/GBL1<0>/ GBLB0<0>/GBLB1<0> | | Voltage level on GBL0<0>/GBL1<0>/ GBLB0<0>/GBLB1<0> | |
|---|---|---|---|---|
| Input76 | LBL = VDD | LBL = 0 | LBL = VDD | LBL = 0 |
| VDD | $I_{00}$ | $I_{00}$ | VDD | VSS |
| V01 | $I_{01}$ | $I_{00}$ | V01 | VSS |
| V10 | $I_{10}$ | $I_{00}$ | V10 | VSS |
| VSS | $I_{11}$ | $I_{00}$ | VSS | VSS |

The header unit 300 is configured to transfer the current on the output lines to the voltage levels. The header unit 300 is connected to the multi-bit input local computing cell 214. The header unit 300 includes a plurality of header cells 310 connected to the output lines, respectively. In FIG. 5, the four header cells 310 are connected to the first output bit line GBL0<j>, the second output bit line GBL1<j>, the first output bit line bar GBLB0<j> and the second output bit line bar GBLB1<j>, respectively. Each of the header cells 310 includes a header transistor HP and a header resistance R. The header transistor HP is connected to a header supply voltage VDDH (e.g., 1.0 V) and an enable signal enb. The header transistor HP is controlled by the enable signal enb and is the PMOS transistor. The header resistance R is connected between the header transistor HP and one of the output lines of the multi-bit input local computing cell 214.

The word line driver 400 is connected to each of the local memory array units 200 via the first word line WL and the second word line HWL<i>. The word line driver 400 is represented by "WL Driver" and is located on a left side of the local memory array units 200. The word line driver 400 generates the voltage level of the first word line WL and the voltage level of the second word line HWL<i> to control each of the local memory array units 200.

The normal IO circuit 500 is connected to each of the local memory array units 200 via the first output bit line GBL0<j> and the first output bit line bar GBLB0<j>. The normal IO circuit 500 is represented by "Normal IO" and is located on a bottom side of the local memory array units 200. The normal IO circuit 500 receives the weights from the local memory array units 200 in the normal mode.

The CIM mode input driver 600 is connected to each of the local memory array units 200 via the first input line Input10<i>, the second input line Input32<i>, the third input line Input54<i> and the fourth input line Input76<i>. The CIM mode input driver 600 is represented by "Input Driver" and is located on a right side of the local memory array units 200. The CIM mode input driver 600 generates the voltage level of each of the input lines (i.e., the multi-bit input value) according to a combined 8-bit input value (IN<7:0>).

The CIM readout circuit 700 is connected to each of the local memory array units 200 via the first output bit line GBL0<j>, the second output bit line GBL1<j>, the first output bit line bar GBLB0<j> and the second output bit line bar GBLB1<j>. The CIM readout circuit 700 is located on a top side of the local memory array units 200. The CIM readout circuit 700 receives the multi-bit output values from the local memory array units 200. In detail, the CIM readout circuit 700 includes a sense amplifier circuit 710 and an adder-shifter circuit 720. The sense amplifier circuit 710 includes a plurality of sense amplifiers. The sense amplifier circuit 710 is represented by "CIM SA" and is connected to the first output bit line GBL0<j>, the second output bit line GBL1<j>, the first output bit line bar GBLB0<j> and the second output bit line bar GBLB1<j>. The sense amplifier circuit 710 receives the multi-bit output values from the first output bit line GBL0<j>, the second output bit line GBL1<j>, the first output bit line bar GBLB0<j> and the second output bit line bar GBLB1<j>. The sense amplifier circuit 710 is configured to transfer the multi-bit output values to a plurality of multi-bit digital output values. In addition, the adder-shifter circuit 720 is represented by "Shift & Adder" and is connected to the sense amplifier circuit 710. The adder-shifter circuit 720 is configured to add and shift the multi-bit digital output values of the sense amplifier circuit 710 to generate a multi-bit CIM output signal.

Therefore, the memory array structure 100 with the multi-bit input local computing cell 214 for the multi-bit CNN based CIM applications of the present disclosure utilizes the multi-bit input local computing cell 214 to support 8 bit input and 1 bit weight computation in one cycle and a voltage dividing technique to avoid time variation. In addition, the structure of the multi-bit input local computing cell 214 of the present disclosure only has 6 transistors, so that the structure does not cost large area overhead.

Figure 6:
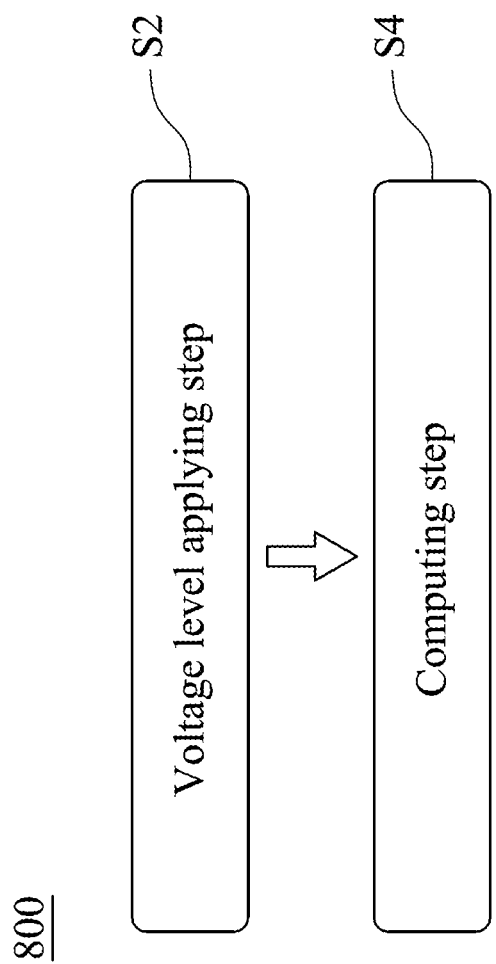
FIG. 6 shows a flow chart of a computing method of a memory array structure with a multi-bit input local computing cell for a plurality of multi-bit CNN based CIM applications according to a second embodiment of the present disclosure.

FIG. 6 shows a flow chart of a computing method 800 of a memory array structure 100 with a multi-bit input local computing cell 214 for a plurality of multi-bit CNN based CIM applications according to a second embodiment of the present disclosure. In FIGS. 1, 2 and 6, the computing method 800 of the memory array structure 100 with the multi-bit input local computing cell 214 for the multi-bit CNN based CIM applications is controlled by the first word line WL and the second word line HWL<i> (e.g., the second word line HWL<0> in FIG. 2). The computing method 800 includes performing a voltage level applying step S2 and a computing step S4.

The voltage level applying step S2 includes applying a plurality of voltage levels to the first word line WL, the second word line HWL<i>, the weight and the input lines (e.g., Input10<0>, Input32<0>, Input54<0> and Input76<0> in FIG. 2) of each of the memory units 210, respectively.

The computing step S4 includes driving the multi-bit input local computing cell 214 of each of the memory units 210 to compute the voltage levels of the input lines and the weight so as to generate the multi-bit output value on each of the output lines (e.g., GBL0<0>, GBL1<0>, GBLB0<0> and GBLB1<0> in FIG. 2) according to the multi-bit input value multiplied by the weight.

Therefore, the computing method 800 of the present disclosure utilizes the multi-bit input local computing cell 214 to support 8 bit input and 1 bit weight computation in one cycle and a voltage dividing technique to avoid time variation, thereby increasing input/weight bits computed per cycle and enhancing the number of operations per second.

Figure 7:
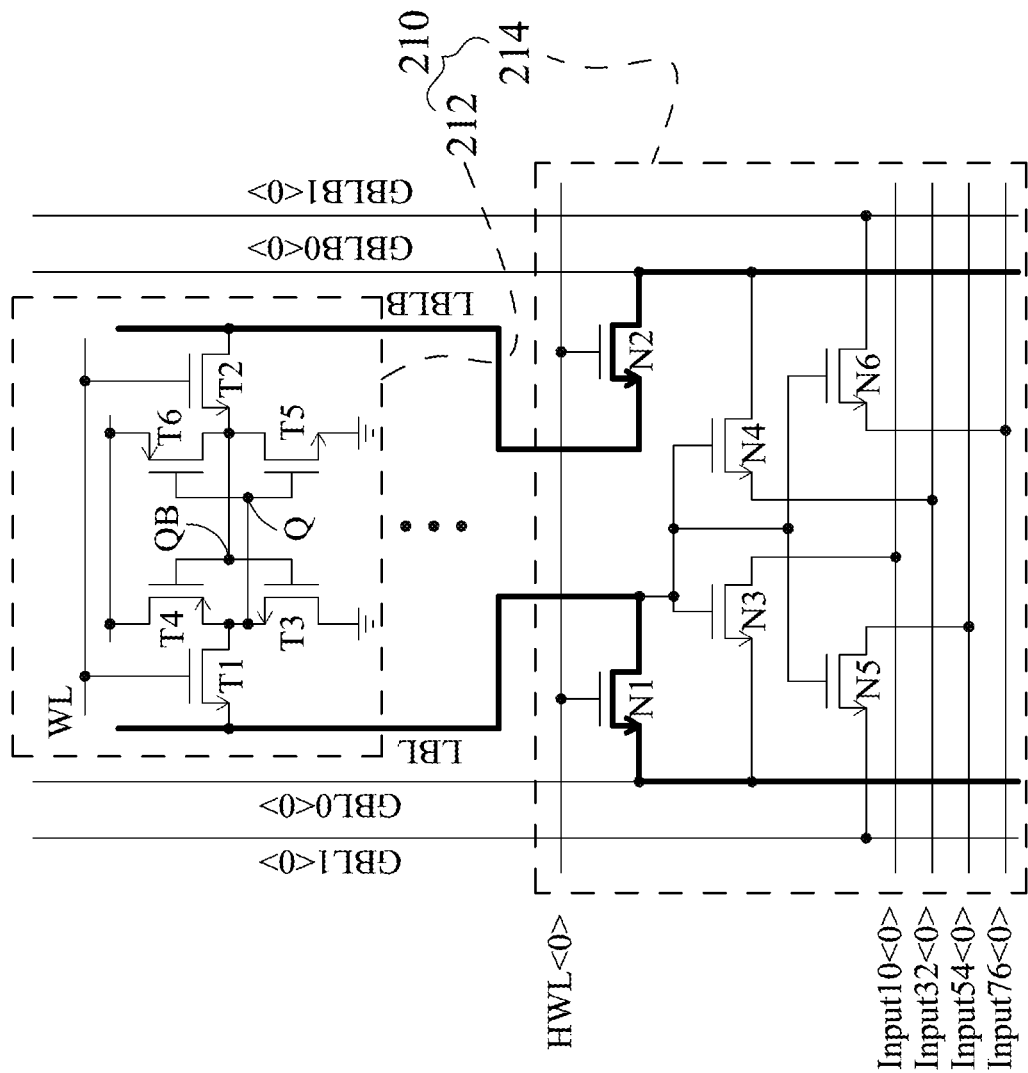
FIG. 7 shows a circuit diagram of a read/write operation of one of the memory units of FIG. 2, which is in the normal mode.
Figure 9:
FIG. 9 shows a timing diagram of a write operation in the normal mode of FIG. 7.
Figure 8:
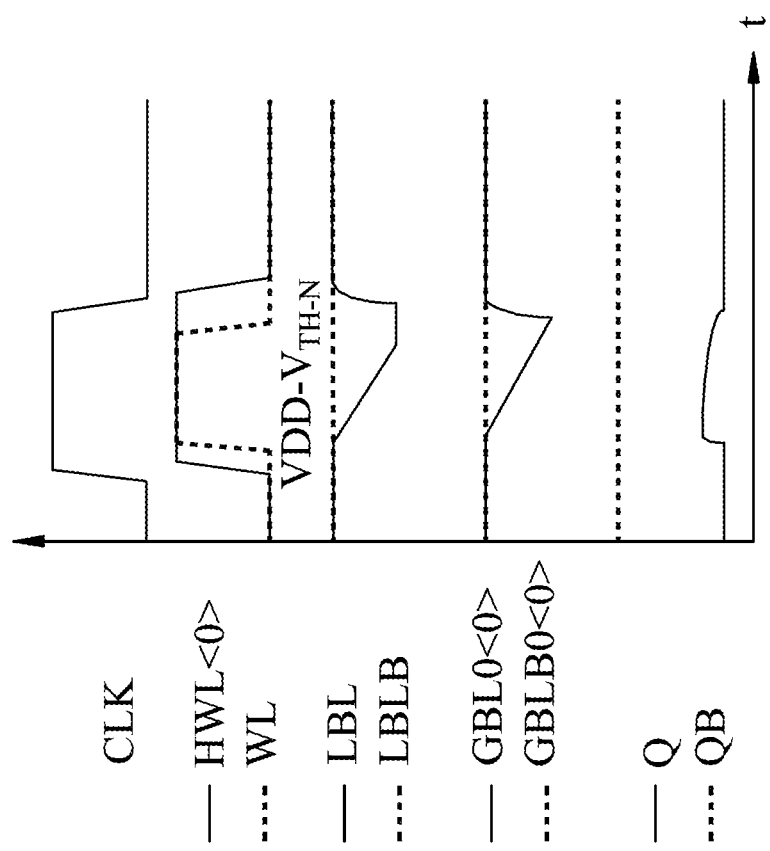
FIG. 8 shows a timing diagram of a read operation in the normal mode of FIG. 7.

FIG. 7 shows a circuit diagram of a read/write operation of one of the memory units 210 of FIG. 2, which is in the normal mode. FIG. 8 shows a timing diagram of a read operation in the normal mode of FIG. 7. FIG. 9 shows a timing diagram of a write operation in the normal mode of FIG. 7. In the normal mode of FIGS. 2, 3 and 7-9, the voltage level of the first word line WL and the voltage level of the second word line HWL<0> are both equal to 1, so that the weight of the first node Q in the memory cell 212 may be transmitted to the first output bit line GBL0<0> via the local bit line LBL and the first local computing cell transistor N1, and the inverted weight of the second node QB in the memory cell 212 may be transmitted to the first output bit line bar GBLB0<0> via the local bit line bar LBLB and the second local computing cell transistor N2. Then, the weight and the inverted weight may be transmitted from the local memory array unit 200 to the normal IO circuit 500 via the first output bit line GBL0<0> and the first output bit line bar GBLB0<0>.

In the read operation of FIG. 8, when the weight of the first node Q is equal to 0, the inverted weight of the second node QB is equal to 1. The voltage level of the local bit line LBL is set to 0, and the voltage level of the local bit line bar LBLB is set to $VDD-V_{TH-N}$. $V_{TH-N}$ represents a threshold voltage of the NMOS transistor. Then, the voltage level of the first output bit line GBL0<0> is set to 0 via the first local computing cell transistor N1, and the voltage level of the first output bit line bar GBLB0<0> is set to VDD.

In the write operation of FIG. 9, when the voltage level of the first output bit line GBL0<0> is equal to 0, the voltage level of the first output bit line bar GBLB0<0> is equal to VDD. The voltage level of the local bit line LBL is set to 0, and the voltage level of the local bit line bar LBLB is set to $VDD-V_{TH-N}$. Then, the voltage level of the first node Q is set to 0, and the voltage level of the second node QB is set to 1.

Figure 10:
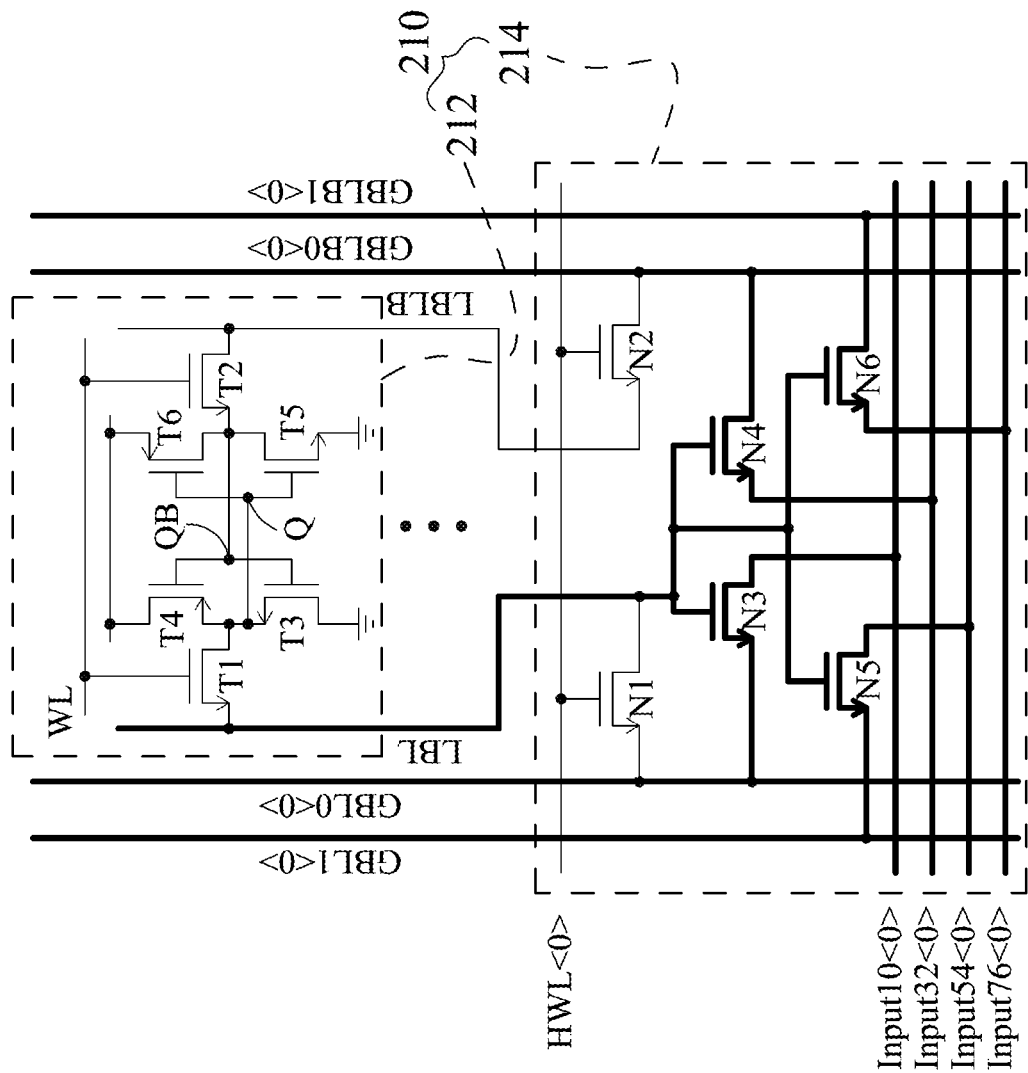
FIG. 10 shows a circuit diagram of a computing operation of one of the memory units of FIG. 2, which is in the CIM mode.
Figure 11:
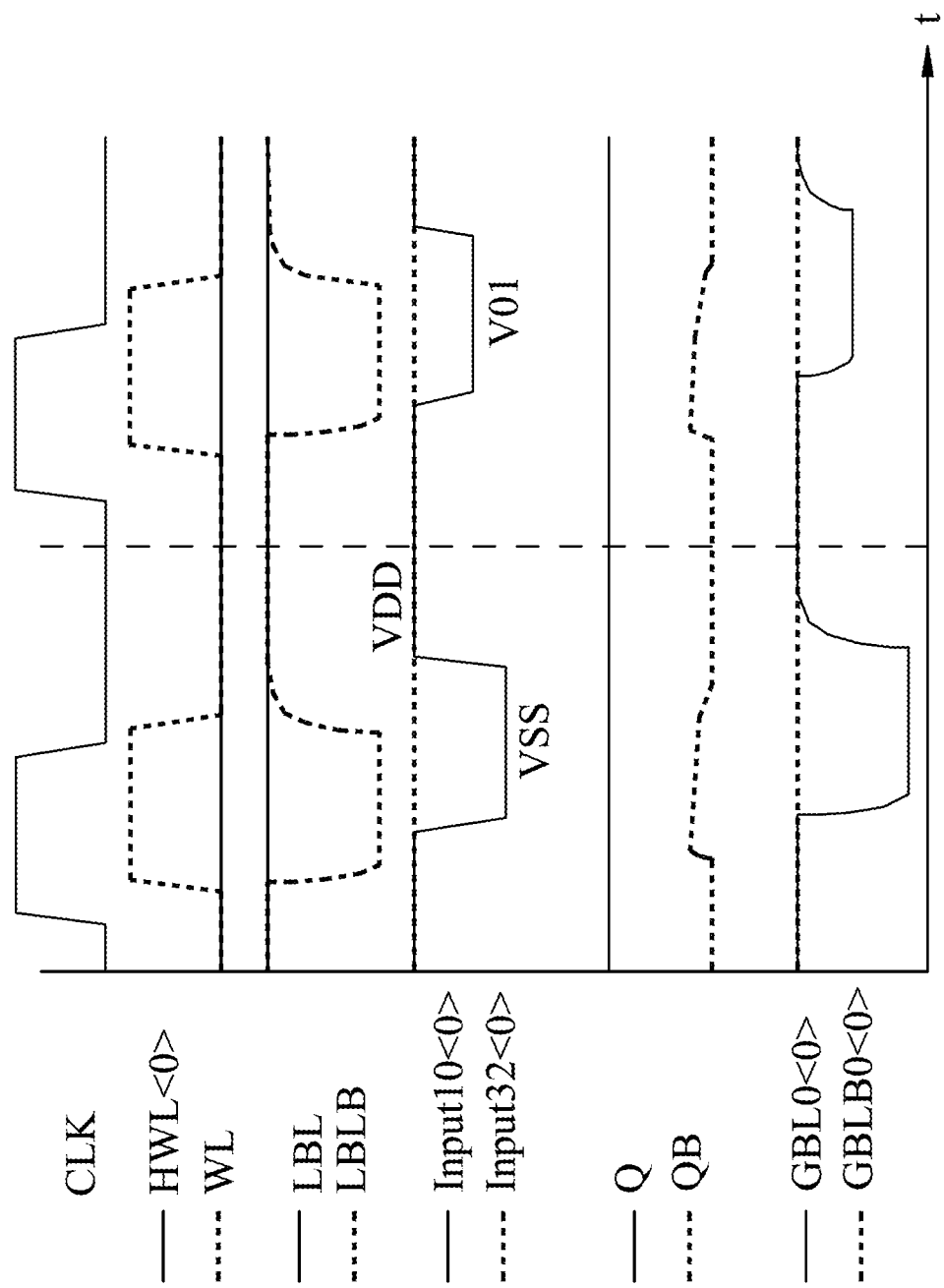
FIG. 11 shows a timing diagram of the computing operation in the CIM mode of FIG. 10.

FIG. 10 shows a circuit diagram of a computing operation of one of the memory units 210 of FIG. 2, which is in the CIM mode. FIG. 11 shows a timing diagram of the computing operation in the CIM mode of FIG. 10. In the CIM mode of FIGS. 2, 4 and 10-11, the voltage level of the first word line WL and the voltage level of the second word line HWL<0> are equal to 1 and 0, respectively, so that the first local computing cell transistor N1 and the second local computing cell transistor N2 are turned off. A first multi-bit input value (e.g., one of VDD, V01, V10 and VSS) of the first input line Input10<0> is transmitted to the third local computing cell transistor N3. A first multi-bit output value is revealed on the first output bit line GBL0<0> via the third local computing cell transistor N3. The first multi-bit output value is equal to the first multi-bit input value multiplied by the weight. A second multi-bit input value (e.g., one of VDD, V01, V10 and VSS) of the second input line Input32<0> is transmitted to the fourth local computing cell transistor N4. A second multi-bit output value is revealed on the first output bit line bar GBLB0<0> via the fourth local computing cell transistor N4. The second multi-bit output value is equal to the second multi-bit input value multiplied by the weight. A third multi-bit input value (e.g., one of VDD, V01, V10 and VSS) of the third input line Input54<0> is transmitted to the fifth local computing cell transistor N5. A third multi-bit output value is revealed on the second output bit line GBL1<0> via the fifth local computing cell transistor N5. The third multi-bit output value is equal to the third multi-bit input value multiplied by the weight. A fourth multi-bit input value (e.g., one of VDD, V01, V10 and VSS) of the fourth input line Input76<0> is transmitted to the sixth local computing cell transistor N6. A fourth multi-bit output value is revealed on the second output bit line bar GBLB1<0> via the sixth local computing cell transistor N6. The fourth multi-bit output value is equal to the fourth multi-bit input value multiplied by the weight. For example, in FIG. 11, the weight of the first node Q is equal to "1". The first multi-bit input value of the first input line Input10<0> is equal to VSS and is transmitted to the third local computing cell transistor N3. The first multi-bit output value is revealed on the first output bit line GBL0<0> via the third local computing cell transistor N3. The first multi-bit output value is equal to the first multi-bit input value multiplied by the weight, so that the voltage level of the first output bit line GBL0<0> is equal to VSS.

Figure 12:
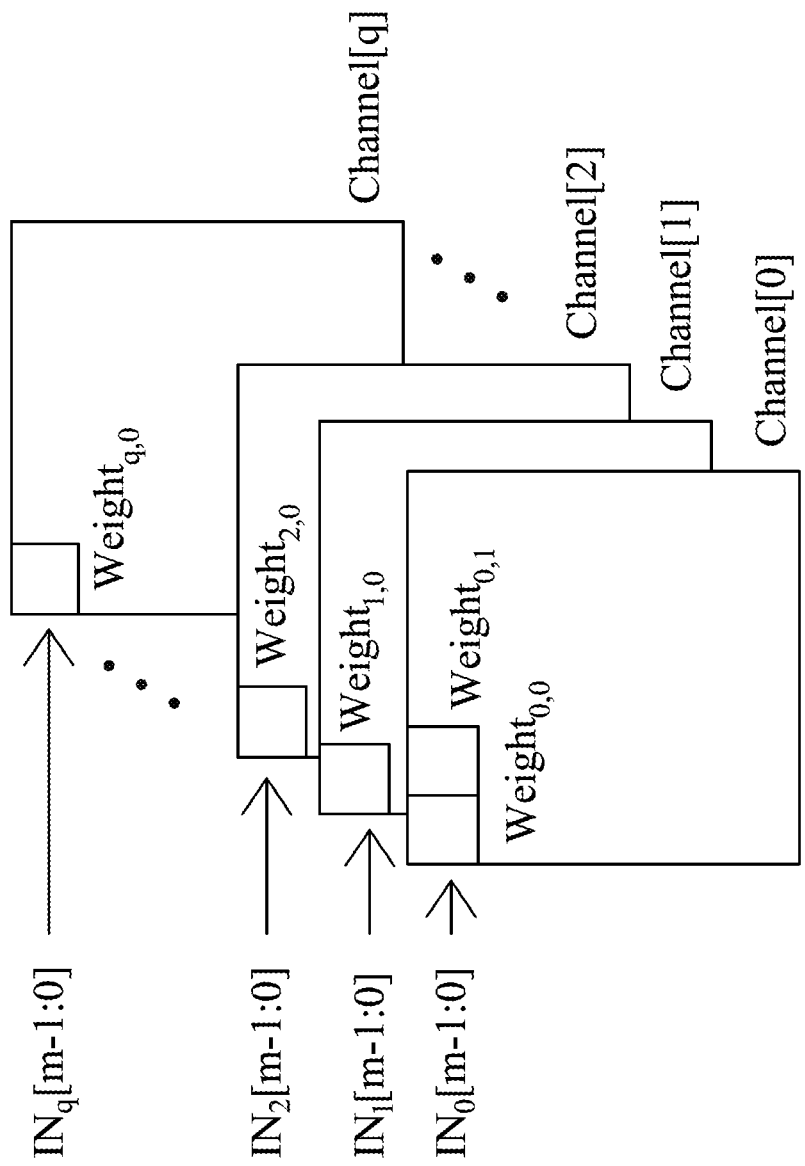
FIG. 12 shows a schematic view of a convolutional operation of a neural network model with a multi-channel computation.
Figure 13:
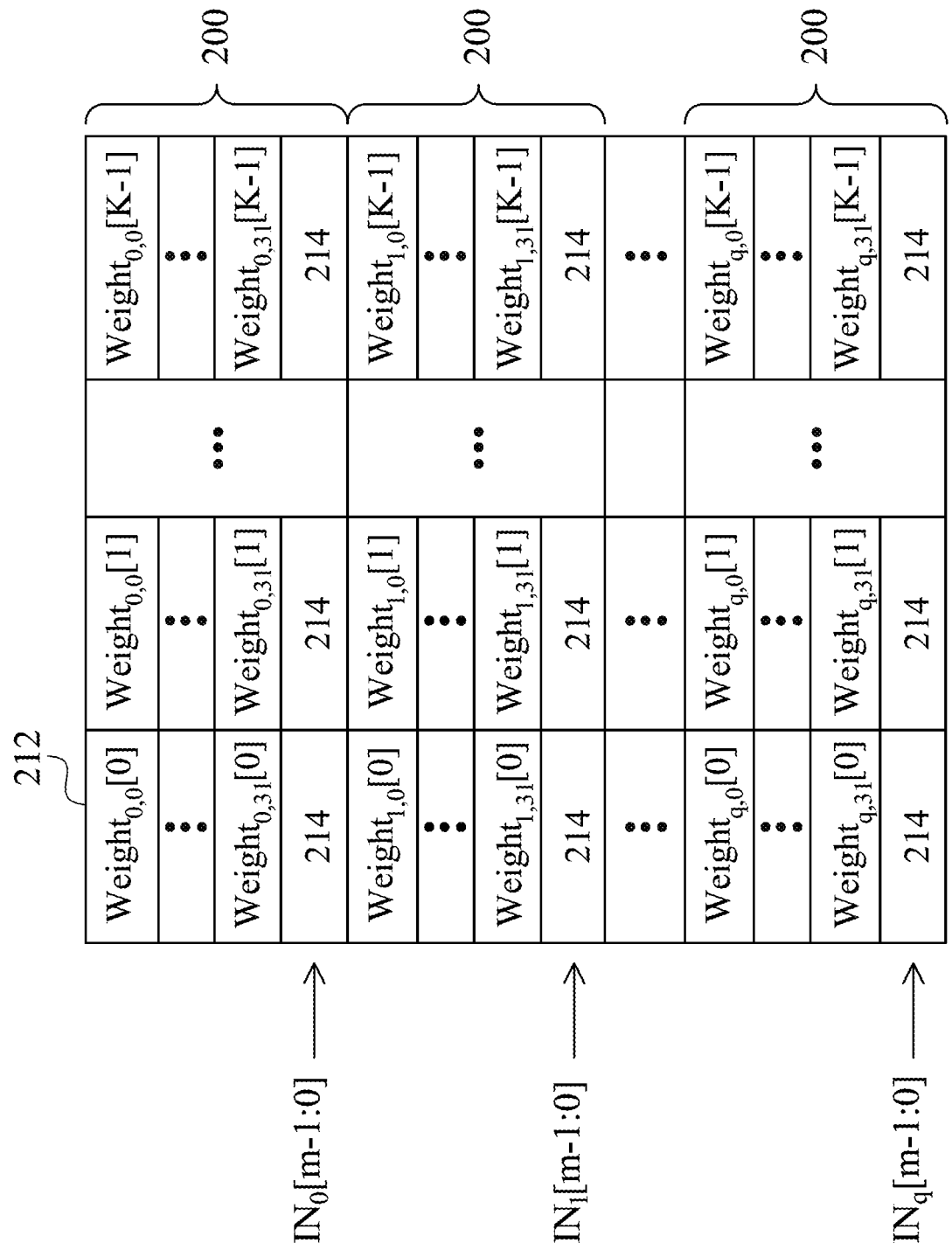
FIG. 13 shows a schematic view of a multiply-accumulate operation of a plurality of local memory array units for the multi-bit CNN with 32 memory cells.

FIG. 12 shows a schematic view of a convolutional operation of a neural network model with a multi-channel computation. FIG. 13 shows a schematic view of a multiply-accumulate operation of a plurality of local memory array units 200 for the multi-bit CNN with 32 memory cells (6T SRAM). The convolutional operation of the neural network model with the multi-channel computation is performed with a plurality of combined 8-bit input values $IN_n[m-1:0]$ and a plurality of 1-bit weights $Weight_{n,p}$. n is an integer between 0 to q. m is equal to 8. p is an integer between 0 to 31. The channel number of the multi-channel computation is equal to q+1, i.e., Channel[0]-Channel[q] in FIG. 12. When the multi-channel computation is performed with the combined 8-bit input values $IN_n[m-1:0]$ and a plurality of multi-bit weights $Weight_{n,p}[k-1:0]$, the structure of the multiply-accumulate operation of a plurality of local memory array units 200 can be shown in FIG. 13, and the computation equation can be described as follows:

$$OUT_0 = \sum_{n=0}^{q} IN_n[m-1:0] \times Weight_{n,0}[k-1:0]. \quad (1)$$

$$\begin{aligned}IN_n[m-1:0] \times Weight_{n,0}[k-1:0] = \quad &(2)\\ IN_n[m-1:0] \times Weight_{n,0}[0] \times 2^0 + \\ IN_n[m-1:0] \times Weight_{n,0}[1] \times 2^1 + \ldots + \\ IN_n[m-1:0] \times Weight_{n,0}[k-1] \times 2^{k-1}.\end{aligned}$$

According to the aforementioned embodiments and examples, the advantages of the present disclosure are described as follows.

1. The memory unit with the multi-bit input local computing cell for the multi-bit CNN based CIM applications and the memory array structure with the multi-bit input local computing cell for the multi-bit CNN based CIM applications can utilize the multi-bit input local computing cell to support 8 bit input and 1 bit weight computation in one cycle and a voltage dividing technique to avoid time variation. In addition, the structure of the multi-bit input local computing cell of the present disclosure only has 6 transistors, so that the structure does not cost large area overhead.

2. The computing method of the present disclosure can utilize the multi-bit input local computing cell to support 8 bit input and 1 bit weight computation in one cycle and a voltage dividing technique to avoid time variation, thereby increasing input/weight bits computed per cycle and enhancing the number of operations per second.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory unit with a multi-bit input local computing cell for a plurality of multi-bit convolutional neural network based computing-in-memory applications, which is controlled by a first word line and a second word line, and the memory unit with the multi-bit input local computing cell for the multi-bit convolutional neural network based computing-in-memory applications comprising:
at least one memory cell storing a weight, wherein the at least one memory cell is controlled by the first word line and comprises a local bit line transmitting the weight; and
the multi-bit input local computing cell connected to the at least one memory cell and receiving the weight via the local bit line, wherein the multi-bit input local computing cell comprises a plurality of input lines and a plurality of output lines, each of the input lines transmits a multi-bit input value, and the multi-bit input local computing cell is controlled by the second word line to generate a multi-bit output value on each of the output lines according to the multi-bit input value multiplied by the weight;
wherein the input lines comprise a first input line and a second input line, the output lines comprise a first output bit line and a first output bit line bar, and the multi-bit input local computing cell further comprises:
a first local computing cell transistor connected to the second word line, the local bit line and the first output bit line;
a second local computing cell transistor connected to the second word line, a local bit line bar and the first output bit line bar;
a third local computing cell transistor connected to the local bit line, the first input line and the first output bit line; and
a fourth local computing cell transistor connected to the local bit line, the second input line and the first output bit line bar.

2. The memory unit with the multi-bit input local computing cell for the multi-bit convolutional neural network based computing-in-memory applications of claim 1, wherein the at least one memory cell further comprises:
a first node storing the weight;
a second node storing an inverted weight opposite to the weight of the first node;
the local bit line bar connected to the multi-bit input local computing cell and transmitting the inverted weight to the multi-bit input local computing cell;

a first memory cell transistor connected to the first node, the local bit line and the first word line;

a second memory cell transistor connected to the second node, the local bit line bar and the first word line;

a first inverter located between the first node and the second node; and a second inverter connected to the first inverter.

3. The memory unit with the multi-bit input local computing cell for the multi-bit convolutional neural network based computing-in-memory applications of claim 1, wherein the input lines further comprise a third input line and a fourth input line;

the output lines further comprise a second output bit line and a second output bit line bar; and the multi-bit input local computing cell further comprises:
a fifth local computing cell transistor connected to the local bit line, the third input line and the second output bit line; and
a sixth local computing cell transistor connected to the local bit line, the fourth input line and the second output bit line bar.

4. The memory unit with the multi-bit input local computing cell for the multi-bit convolutional neural network based computing-in-memory applications of claim 3, wherein, a voltage level of the first word line and a voltage level of the second word line are set to 1 and 0, respectively;

a third multi-bit input value of the third input line is transmitted to the fifth local computing cell transistor, a third multi-bit output value is revealed on the second output bit line via the fifth local computing cell transistor, and the third multi-bit output value is equal to the third multi-bit input value multiplied by the weight; and a fourth multi-bit input value of the fourth input line is transmitted to the sixth local computing cell transistor, a fourth multi-bit output value is revealed on the second output bit line bar via the sixth local computing cell transistor, and the fourth multi-bit output value is equal to the fourth multi-bit input value multiplied by the weight.

5. The memory unit with the multi-bit input local computing cell for the multi-bit convolutional neural network based computing-in-memory applications of claim 1, wherein, a voltage level of the first word line and a voltage level of the second word line are set to 1 and 0, respectively;

a first multi-bit input value of the first input line is transmitted to the third local computing cell transistor, a first multi-bit output value is revealed on the first output bit line via the third local computing cell transistor, and the first multi-bit output value is equal to the first multi-bit input value multiplied by the weight; and a second multi-bit input value of the second input line is transmitted to the fourth local computing cell transistor, a second multi-bit output value is revealed on the first output bit line bar via the fourth local computing cell transistor, and the second multi-bit output value is equal to the second multi-bit input value multiplied by the weight.

6. The memory unit with the multi-bit input local computing cell for the multi-bit convolutional neural network based computing-in-memory applications of claim 1, wherein, the multi-bit input value is an analog signal and is equal to one of four voltage levels;

each of the input lines is extended in a horizontal direction; and each of the output lines is extended in a vertical direction.

7. A memory array structure with a multi-bit input local computing cell for a plurality of multi-bit convolutional neural network based computing-in-memory applications, which is controlled by a first word line and a second word line, and the memory array structure with the multi-bit input local computing cell for the multi-bit convolutional neural network based computing-in-memory applications comprising:

a plurality of memory units connected to each other via the first word line and the second word line, wherein each of the memory units comprises:
at least one memory cell storing a weight, wherein the at least one memory cell is controlled by the first word line and comprises a local bit line transmitting the weight; and
the multi-bit input local computing cell connected to the at least one memory cell and receiving the weight via the local bit line, wherein the multi-bit input local computing cell comprises a plurality of input lines and a plurality of output lines, each of the input lines transmits a multi-bit input value, and the multi-bit input local computing cell is controlled by the second word line to generate a multi-bit output value on each of the output lines according to the multi-bit input value multiplied by the weight;

wherein the input lines comprise a first input line and a second input line, the output lines comprise a first output bit line and a first output bit line bar, and the multi-bit input local computing cell further comprises:
a first local computing cell transistor connected to the second word line, the local bit line and the first output bit line;
a second local computing cell transistor connected to the second word line, a local bit line bar and the first output bit line bar:
a third local computing cell transistor connected to the local bit line, the first input line and the first output bit line; and
a fourth local computing cell transistor connected to the local bit line, the second input line and the first output bit line bar.

8. The memory array structure with the multi-bit input local computing cell for the multi-bit convolutional neural network based computing-in-memory applications of claim 7, wherein the at least one memory cell further comprises:

a first node storing the weight;

a second node storing an inverted weight opposite to the weight of the first node;

the local bit line bar connected to the multi-bit input local computing cell and transmitting the inverted weight to the multi-bit input local computing cell;

a first memory cell transistor connected to the first node, the local bit line and the first word line;

a second memory cell transistor connected to the second node, the local bit line bar and the first word line;

a first inverter located between the first node and the second node; and a second inverter connected to the first inverter.

9. The memory array structure with the multi-bit input local computing cell for the multi-bit convolutional neural network based computing-in-memory applications of claim 7, wherein the input lines further comprise a third input line and a fourth input line;

the output lines further comprise a second output bit line and a second output bit line bar; and the multi-bit input local computing cell further comprises:
a fifth local computing cell transistor connected to the local bit line, the third input line and the second output bit line; and
a sixth local computing cell transistor connected to the local bit line, the fourth input line and the second output bit line bar.

10. The memory array structure with the multi-bit input local computing cell for the multi-bit convolutional neural network based computing-in-memory applications of claim 9, wherein,
a voltage level of the first word line and a voltage level of the second word line are set to 1 and 0, respectively;
a third multi-bit input value of the third input line is transmitted to the fifth local computing cell transistor, a third multi-bit output value is revealed on the second output bit line via the fifth local computing cell transistor, and the third multi-bit output value is equal to the third multi-bit input value multiplied by the weight; and
a fourth multi-bit input value of the fourth input line is transmitted to the sixth local computing cell transistor, a fourth multi-bit output value is revealed on the second output bit line bar via the sixth local computing cell transistor, and the fourth multi-bit output value is equal to the fourth multi-bit input value multiplied by the weight.

11. The memory array structure with the multi-bit input local computing cell for the multi-bit convolutional neural network based computing-in-memory applications of claim 7, wherein,
a voltage level of the first word line and a voltage level of the second word line are set to 1 and 0, respectively;
a first multi-bit input value of the first input line is transmitted to the third local computing cell transistor, a first multi-bit output value is revealed on the first output bit line via the third local computing cell transistor, and the first multi-bit output value is equal to the first multi-bit input value multiplied by the weight; and
a second multi-bit input value of the second input line is transmitted to the fourth local computing cell transistor, a second multi-bit output value is revealed on the first output bit line bar via the fourth local computing cell transistor, and the second multi-bit output value is equal to the second multi-bit input value multiplied by the weight.

12. The memory array structure with the multi-bit input local computing cell for the multi-bit convolutional neural network based computing-in-memory applications of claim 7, wherein,
the multi-bit input value is an analog signal and is equal to one of four voltage levels;
each of the input lines is extended in a horizontal direction; and
each of the output lines is extended in a vertical direction.

13. The memory array structure with the multi-bit input local computing cell for the multi-bit convolutional neural network based computing-in-memory applications of claim 7, further comprising:
a header unit connected to the multi-bit input local computing cell, wherein the header unit comprises a plurality of header cells connected to the output lines, respectively, and each of the header cells comprises:
a header transistor connected to a header supply voltage and an enable signal, wherein the header transistor is controlled by the enable signal; and
a header resistance connected between the header transistor and one of the output lines of the multi-bit input local computing cell.

14. A computing method of the memory array structure with the multi-bit input local computing cell for the multi-bit convolutional neural network based computing-in-memory applications of claim 7, which is controlled by the first word line and the second word line, and the computing method comprising:
performing a voltage level applying step, wherein the voltage level applying step comprises applying a plurality of voltage levels to the first word line, the second word line, the weight and the input lines of each of the memory units, respectively; and
performing a computing step, wherein the computing step comprises driving the multi-bit input local computing cell of each of the memory units to compute the voltage levels of the input lines and the weight so as to generate the multi-bit output value on each of the output lines according to the multi-bit input value multiplied by the weight.

15. The computing method of claim 14, wherein,
the input lines further comprise a third input line and a fourth input line;
the output lines further comprise a second output bit line and a second output bit line bar; and
the multi-bit input local computing cell further comprises:
a fifth local computing cell transistor connected to the local bit line, the third input line and the second output bit line; and
a sixth local computing cell transistor connected to the local bit line, the fourth input line and the second output bit line bar.

16. The computing method of claim 15, wherein in the computing step,
a voltage level of the first word line and a voltage level of the second word line are set to 1 and 0, respectively;
a third multi-bit input value of the third input line is transmitted to the fifth local computing cell transistor, a third multi-bit output value is revealed on the second output bit line via the fifth local computing cell transistor, and the third multi-bit output value is equal to the third multi-bit input value multiplied by the weight; and
a fourth multi-bit input value of the fourth input line is transmitted to the sixth local computing cell transistor, a fourth multi-bit output value is revealed on the second output bit line bar via the sixth local computing cell transistor, and the fourth multi-bit output value is equal to the fourth multi-bit input value multiplied by the weight.

17. The computing method of claim 14, wherein in the computing step,
a voltage level of the first word line and a voltage level of the second word line are set to 1 and 0, respectively;
a first multi-bit input value of the first input line is transmitted to the third local computing cell transistor, a first multi-bit output value is revealed on the first output bit line via the third local computing cell transistor, and the first multi-bit output value is equal to the first multi-bit input value multiplied by the weight; and
a second multi-bit input value of the second input line is transmitted to the fourth local computing cell transistor, a second multi-bit output value is revealed on the first output bit line bar via the fourth local computing cell transistor, and the second multi-bit output value is equal to the second multi-bit input value multiplied by the weight.

\* \* \* \* \*